United States Patent [19]

Vinarub

[11] 4,356,432
[45] Oct. 26, 1982

[54] SOLID STATE POWER SWITCH FOR GAS DISCHARGE LAMPS

[75] Inventor: Edmond I. Vinarub, Cheshire, Conn.

[73] Assignee: Exxon Research and Engineering Co., Florham Park, N.J.

[21] Appl. No.: 238,143

[22] Filed: Feb. 25, 1981

[51] Int. Cl.³ .............................................. H05B 41/36
[52] U.S. Cl. ...................... 315/287; 315/205; 315/224; 315/291; 315/DIG. 7
[58] Field of Search ............. 315/205, 208, 209 R, 315/224, 287, 291, DIG. 4, DIG. 5, DIG. 7; 323/326, 351

[56] References Cited

U.S. PATENT DOCUMENTS

| | | | |
|---|---|---|---|
| 3,896,336 | 7/1975 | Schreiner et al. | 315/DIG. 7 |
| 3,949,267 | 4/1976 | Collins | 315/DIG. 7 |
| 4,121,136 | 10/1978 | Fournier et al. | 315/287 X |
| 4,170,747 | 10/1979 | Holmes | 315/205 X |

*Primary Examiner*—Eugene R. La Roche

[57] ABSTRACT

A solid state power switch for gas discharge lamps is disclosed which is capable of providing a bipolar signal to a lamp and which substantially eliminates losses due to switching delays of internal devices. A timing control signal of a predetermined frequency and wave shape is provided to a pair of threshold comparators, which respectively receive a first and second threshold signal such as first and second reference voltages. The first comparator produces an output signal only when the timing control signal is below the first threshold signal and the second comparator provides an output signal only when the timing control signal is above the second threshold signal. The signals from the two comparators are used to control the on time of power switches of opposite polarity. Thus, the time that the control signal is between the two thresholds represents the switching delay interval. By adjusting the two threshold signals relative to each other, a delay interval of any desired duration may be created between the turn off of one power switch and turn on of the other, thus allowing independent and precise control of switching of the power switching devices.

8 Claims, 6 Drawing Figures

SOLID STATE POWER SWITCH FOR GAS DISCHARGE LAMPS

BACKGROUND OF THE INVENTION

This invention relates generally to a solid state high frequency ballast or power switching system for gas discharge lamps and, more specifically, to an improved method and apparatus for wave shaping and timing in such a system.

Gas discharge lamps, such as fluorescent lamps, operate with a negative volt-ampere characteristic whereby the resistance of the lamp decreases in response to an increase in current. In order to prevent a buildup of current which would otherwise lead to the lamp's destruction, ballast devices are used to limit the amount of current delivered to the lamp. A conventional ballast uses reactive components such as inductors and capacitors whose values are selected in order to obtain this power limiting effect for a given operating frequency.

One of the disadvantages inherent in the use of such ballast devices is the bulk and expense of components which are capable of operating at 60 Hz line frequency, as well as the power or storage losses associated with the charging and discharging of said components at such low frequencies. In order to overcome these disadvantages, ballast circuits have been proposed which use solid state circuitry to supply a high frequency signal to the lamp, thus allowing a reduction in the size of the reactive components in said circuits, and consequently reducing bulk, storage losses, and cost of production.

One method which has been proposed in order to obtain the desired conversion from 60 cycle a.c. to high frequency operation involves the use of solid state chopper circuits to shape the incoming a.c. line signal. A standard chopper circuit acts as a high frequency switch with respect to an incoming power signal, chopping the signal by switching it on and off at a predetermined chopper frequency and delivering the resulting signal to output terminals. Since the standard chopper circuit results in an "off" interval in each cycle during which no power is transmitted to the load, said circuits have been modified to supply a reverse polarity signal to the load instead of the standard off interval. This permits greater power transfer to the load, thus increasing the output of the circuit without the need for transformers or other reactive components.

U.S. Pat. No. 3,896,336 to Schreiner et al discloses a modified chopper circuit and ballast system which alternately reverses the polarity of a power signal applied across the terminals of a gas discharge lamp at a frequency of 10 kHz. Ideally this circuit would replace the off interval of a standard chopper circuit with a reversed output signal which is approximately equal in amplitude and duration to the normal on portion of the chopped signal, but is reversed in polarity, thus producing a bipolar signal supplying twice as much power to the lamp as a standard chopper circuit. Polarity reversals are achieved by means of two alternately operated solid state switching circuits coupled to connect the power signal across a lamp circuit with opposite polarities. This requires a brief delay between turn on of one switching circuit and turn off of the other to prevent short circuiting of the input power source and possible destruction of power transistors or other components in the switching circuits. The ideal power doubling effect is therefore lessened by the duration of this brief delay.

A common problem with past switching circuits of this type has been the failure of the associated timing circuitry to provide a simple and effective means for adjusting the duration of the delay. The delay should, preferably, be adjusted to its minimum duration, thereby maximizing the "on" time of the switching circuits in order to provide maximum AC power to the lamp. Presently available switching systems utilize a high frequency oscillator to generate a control signal for alternately operating switching circuits to produce a bipolar signal as explained above. The delay between amplitude reversals is then timed for an interval equal to one half-cycle of the high frequency oscillator. Depending on the speed of the switching transistors or other devices, this delay step may be many times longer than is actually required to allow complete turn off of one switching circuit and turn on of the other, thus preventing optimum power transfer to the lamp.

Broadly, it is an object of the present invention to provide a delay interval between amplitude reversals of a power switching circuit which is entirely independent of the timing of the amplitude reversals. It is specifically contemplated that a power switching circuit be provided which connects a pair of input terminals to a pair of output terminals with alternating polarity, there being provided a brief interval between polarity reversals during which there is no connection between the input and output terminals.

It is also an object of this invention to provide a convenient means for adjusting the timing of the delay interval between amplitude reversals in a power switching circuit to achieve maximum on time of the switching devices.

It is a further object of the invention to provide such adjustment over a relatively broad portion of the power switching cycle, to permit the use of the timing circuit with different transistors having a variety of switching speeds.

It is yet another object of the present invention to achieve the timing of the delay period and the switching control signals with one timing oscillator and a minimum of associated wave shaping circuitry.

SUMMARY OF THE INVENTION

In accordance with a presently preferred, but nonetheless illustrative embodiment of the invention, the foregoing objects, and other objects, features and advantages, which will become apparent as the description proceeds, are achieved by providing a timing control signal of a predetermined frequency and wave shape to a pair of threshold comparators, which respectively receive a first and second threshold signal such as first and second reference voltages. The first comparator produces an output signal only when the timing control signal is below the first threshold signal and the second comparator provides an output signal only when the timing control signal is above the second threshold signal. The signals from the two comparators are used to control the on time of power switches of opposite polarity. Thus, the time that the control signal is between the two thresholds represents the switching delay interval. By adjusting the two threshold signals relative to each other, a delay interval of any desired duration may be created between the turn off of one power switch and turn on of the other, thus allowing independent and precise control of switching of the power switching devices.

BRIEF DESCRIPTION OF THE DRAWINGS

For a better understanding of the invention, reference should be made to the accompanying drawings, wherein.

Figure 1:
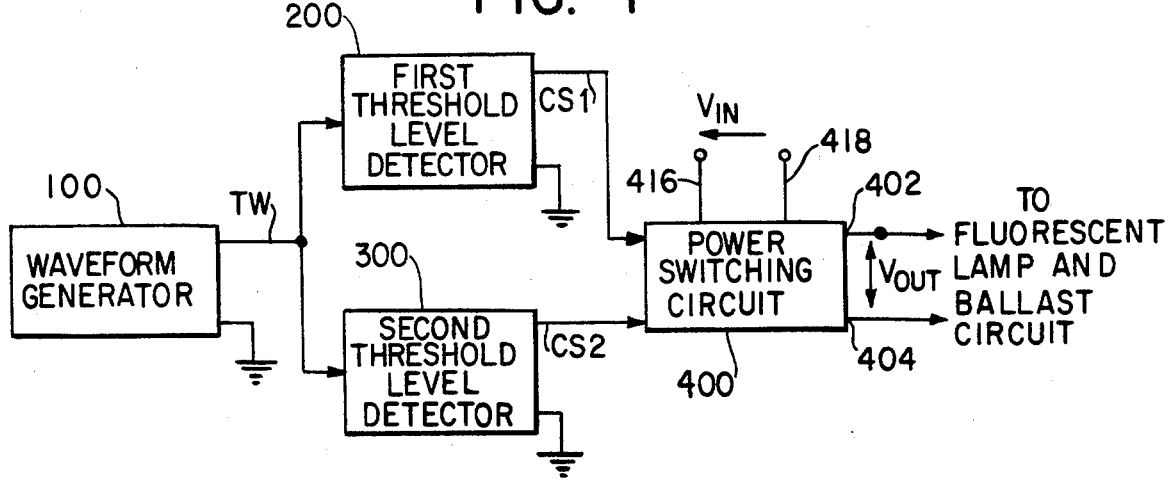
FIG. 1 is a functional block diagram illustrating a power switching circuit in accordance with the invention adapted for connection with a suitable fluorescent lamp and ballast circuit.

DESCRIPTION OF THE PREFERRED EMBODIMENTS:

Referring now to the details of the drawing, FIG. 1 is a functional block diagram of a solid state ballast and power switching system incorporating the invention. The power switching system broadly comprises: a waveform generator 100, which produces a timing control signal, preferably a triangular waveform; a first threshold level detector 200 responsive to the timing control signal to provide a first control signal CS1; a second threshold level detector 300 responsive to the timing control signal to provide a second control signal CS2; and a power switching circuit 400 having input leads 416 and 418 and output leads 402 and 404 and jointly responsive to CS1 and CS2 to connect the leads 416 and 418 with a first polarity to leads 402 and 404 when CS1 controls power switching circuit 400 and with the opposite polarity when CS 2 controls power switching circuit 400 (CS1 and CS2 cannot simultaneously control power switching circuit 400).

Figure 2:
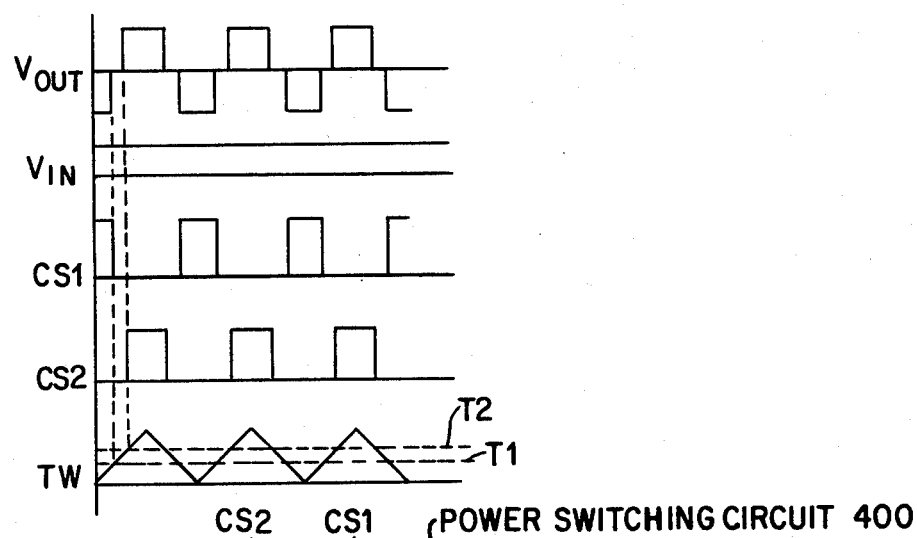
FIG. 2 is a timing diagram useful in explaining the operation of the system of FIG. 1.

The operation of the system of FIG. 1 is best understood by reference to the timing diagram of FIG. 2 in which waveforms representing the signals produced in FIG. 1 are designated by the corresponding reference characters (e.g. control signal CS1 is designated by these characters). The triangular waveform TW is compared against the threshold levels T1 and T2 in threshold level detectors 200 and 300, respectively. Detector 200 produces a high level in CS1 whenever TW is below T1 and detector 300 produces a high level in CS2 when TW exceeds T2. When TW is between T1 and T2 both CS1 and CS2 are low. In power switching circuit 400, an input signal Vin, shown for exemplary purposes as a D.C. signal, is applied to input leads 416 and 418. When CS2 is high, power switching circuit 400 is caused to connect lead 416 to lead 402 and lead 418 to lead 404. On the other hand, when CS1 is high, terminal 416 is connected to lead 404 and lead 418 is connected to lead 402, thereby providing Vin to leads 402 and 404 with a reversal of polarity (note the negative-going pulses in waveform Vout). When both CS1 and CS2 are low, there is no connection between the input leads 416, 418 and the output leads 402, 404. The resulting output signal Vout is bipolar and has the same frequency as TW. It will be appreciated that the duration of the delay interval (e.g. 10 in Vout) can be controlled by controlling the difference between the threshold levels T1 and T2.

From the foregoing description, it will be appreciated that a gas discharge lamp circuit, such as a fluorescent lamp in combination with a ballast, connected between leads 402 and 404 will be driven by an essentially full power bipolar signal. The lamp circuit may also include components to implement the ignition of the lamp as well as to sustain its illumination.

Figure 3:
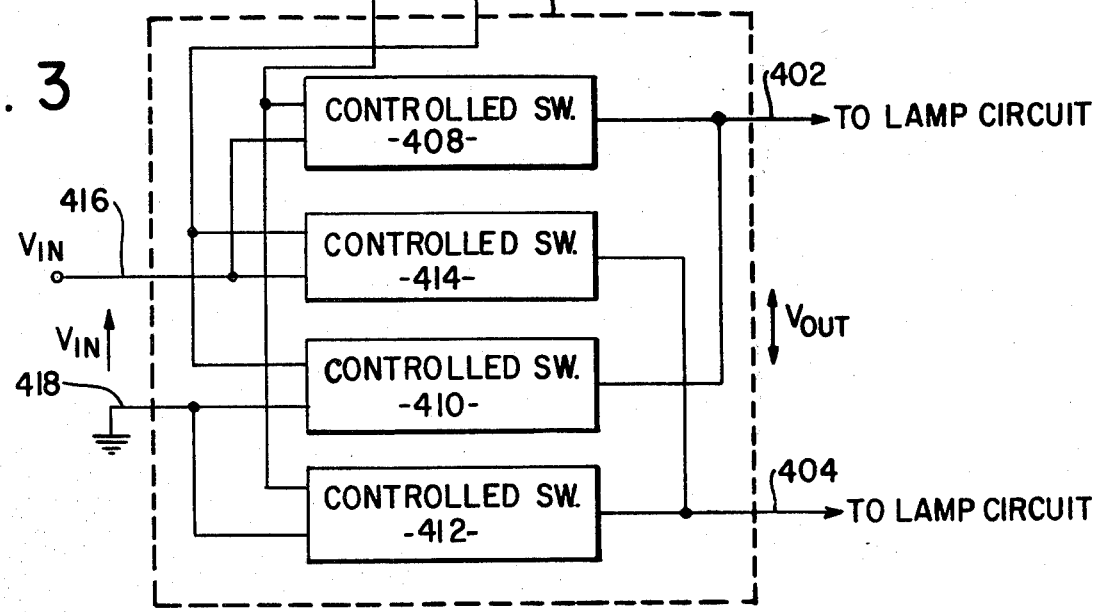
FIG. 3 is a block diagram helpful in understanding the operation of the power switching circuit in FIG. 1.

A block functional diagram of the power switching circuit 400 is shown in FIG. 3 which assists in understanding the operation of this component. Controlled switches 408, 410, 412 and 414 are either open or closed, depending on the state of a respective control signal (CS1 or CS2) applied thereto. Lead 416 is connected to lead 402 through switch 408 and to lead 404 through switch 414, while lead 418 is connected to lead 402 through switch 410 and to lead 404 through switch 412. Pulses in CS1 close switches 410 and 414 only, whereas switches 408 and 412 are closed by pulses in CS2. Thus, CS2 causes transmission of Vin between leads 402 and 404, whereas CS1 causes −Vin to be transmitted thereto. Inasmuch as the pulses in CS1 and CS2 alternate, polarity reversals are produced in Vout to provide a bipolar signal. In the preferred embodiment the frequency of Vout is 20 KHz which results in improved lighting efficiency over 60 Hz systems.

Reference will now be made to a preferred embodiment of the invention, in which the incoming AC line signal is full wave rectified and filtered to provide a DC power source for application to the Power Switching Circuit 400 as Vin. It should be noted that the switching apparatus of the preferred embodiment may be modified in order to permit the invention to be practiced on any incoming waveform, such as 60 cycle AC or rectified 120 cycle pulsating DC.

Figure 4:
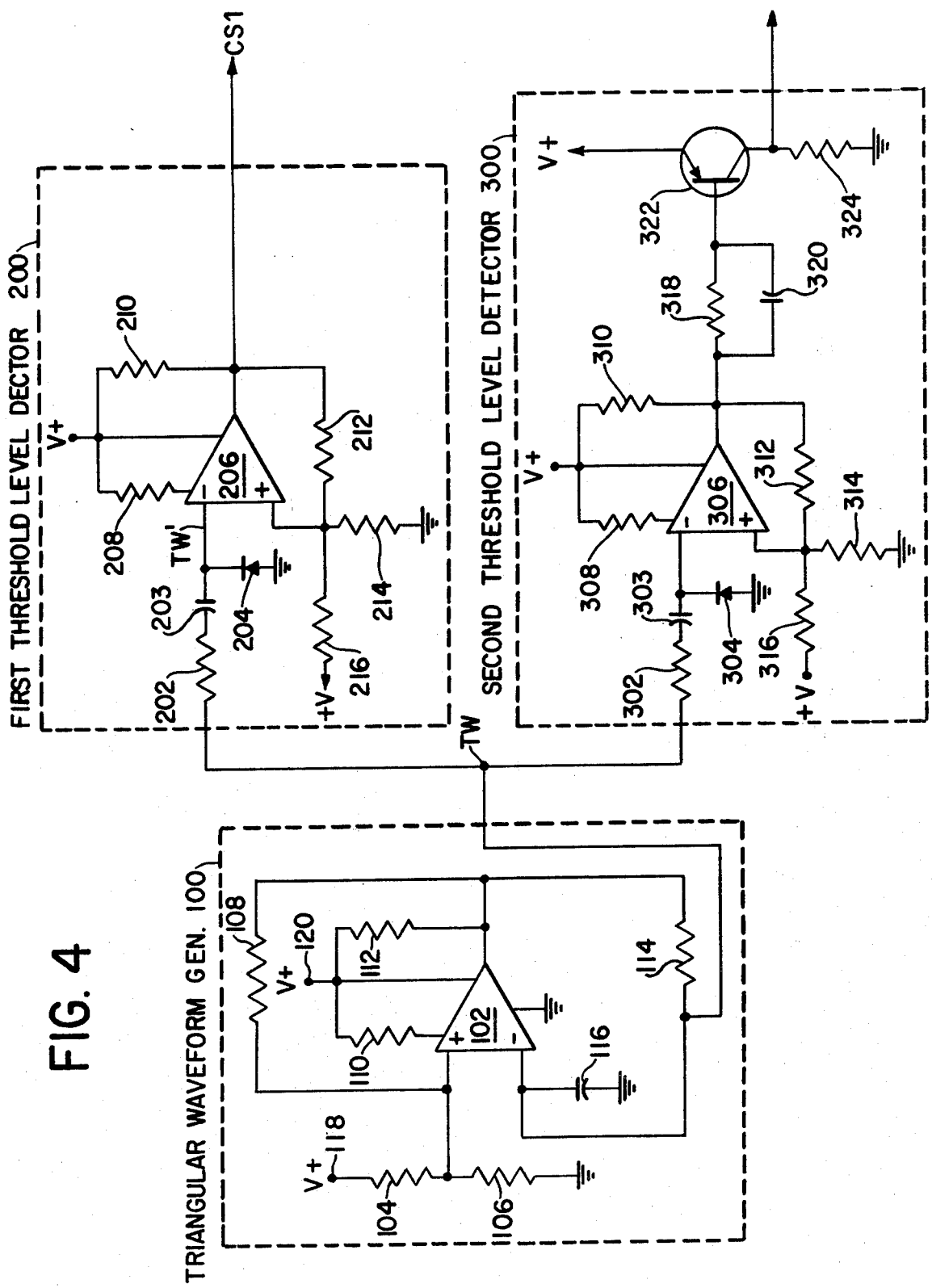
FIG. 4 is a schematic diagram of preferred forms of the wave form generator and first and second threshold detectors of FIG. 1.

FIG. 4 is a schematic diagram illustrating the interconnection of the electrical components which produce the control signals CS1 and CS2 in the preferred embodiment.

Triangular wave form generator 100 comprises an operational transconductance amlifier (OTA) 102 as the RCA Semiconductor CA3080, operated as an astable multi-vibrator. Resistors 104 and 106 act as voltage dividers for the logic voltage V+, providing a reference voltage $V_S$ at the positive terminal of OTA 102. Resistor 108 provides a positive feedback of the output signal to the positive terminal of OTA 102, which accelerates the switching time of the amplifier. Resistors 110 and 112 provide biasing for the OTA. The RC constant of resistor 114 and capacitor 116 is chosen to produce an output of the desired frequency, which is 20 kHz in the preferred embodiment.

In practice OTA 102 is operated in the saturated mode so that the output is driven to V+ upon application of the logic voltage V+ to terminals 118 and 120. Current flows through capacitor 116, charging this capacitor until the negative terminal of OTA 102 rises above $V_S$, causing the amplifier output to go low. Capacitor 116 discharges through resistor 114 until the negative terminal of OTA 102 drops below $V_S$, whereupon the amplifier again switches to provide V+ at its output whereupon charging of capacitor 116 commences to repeat the cycle. By selecting $V_S$ so that capacitor 116 is charged to only a fraction of V+, relatively linear charging and discharging waveforms are achieved, producing a triangular wave form TW at the negative terminal of the amplifier.

After the signal TW has been produced by generator 100, it is provided to detector 200 which determines whether the signal is below the first threshold level T1. Resistor 202, capacitor 203 and diode 204 cooperate to clamp the triangular waveform TW so that it is always above ground level. This clamped signal TW' is provided as an input to the negative terminal of OTA 206, which is used as a signal level comparator. Resistors 208 and 210 provide biasing for the OTA, and resistor 212 provides feedback to the positive terminal of the OTA in order to speed up the switching of the amplifier. Resistors 214 and 216 are used as a voltage divider to provide a first threshold signal or reference voltage T1 at the positive terminal of OTA 206. The value of resistor 212 should be sufficiently high so that the switching of the amplifier from the high to the low state does not substantially affect T1. The amplifier produces a low output until the triangular wave falls below the level of T1, causing the amplifier to saturate and provide V+ at its output. The output will remain at V+ until TW rises again to a level above T1, at which point the amplifier output will return to ground. In the preferred embodiment the level of T1 will be chosen so that the wave generated at the output of 206 will have positive steps which are slightly shorter than one half cycle of TW.

The triangular waveform TW is also provided as an input to the second threshold level detector 300, which performs a similar function to detector 200. Resistor 302, capacitor 303 and diode 304 clamp the triangular waveform above ground, providing the input TW' at the negative terminal of OTA 306. Resistors 308 and 310 provide biasing for 306, and 312 provides positive feedback to aid saturation. Resistors 314 and 316 are chosen to provide a second threshold signal T2 at the positive input of 306. The level of T2 should be slightly higher than T1 in order to produce a delay interval during which neither threshold detector 200 nor 300 shows a high output. By varying the values of resistors 216 and/or 316, the delay interval can be adjusted to any desired duration, allowing the user or manufacturer to fine tune the timing of the power switching circuit for maximum power output. Resistor 318 and capacitor 320 speed up the switching of PNP transistor 322, which inverts the output of OTA 306, providing the signal CS2 across resistor 324.

Figure 5:
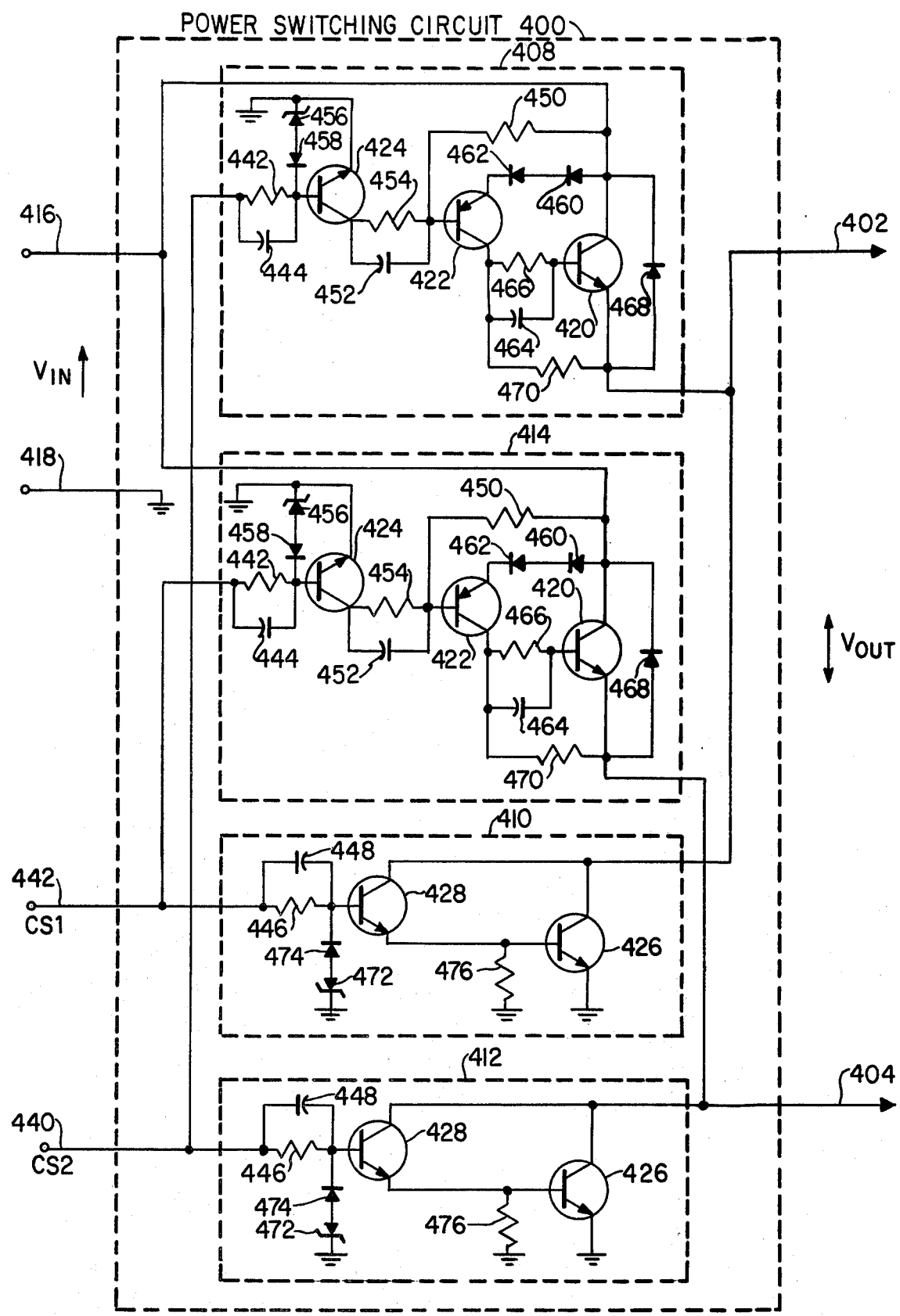
FIG. 5 is a schematic diagram showing a preferred embodiment of the power switching circuit of FIG. 2, using junction transistors.

FIG. 5 is a schematic representation of one embodiment of the power switching circuit 400, using junction transistors in a switching-pair configuration to chop and switch a filtered DC input voltage Vin provided on the input leads 416 and 418. The complementary transistor switching-pair 420 and 422 with its driver transistor 424, achieves the function of controlled switch 408. Switch 414 is identical in all respects to switch 408. The controlled switches 410 and 412 are implemented using a Darlington transistor pair 426 and 428. Control lead 440 receives control signal CS2 and control lead 442 receives CS1. When CS2 goes high, this is coupled to the bases of transistors 424 and 428 (in switches 408 and 412 respectively) via RC speed-up networks 442,444 and 446,448, causing switches 408 and 412 to close (become conductive). The base drive saturates 424 which in turn, draws current out of the base of 422, causing it to saturate. Speedup network 452, 454 improves the switching speed of 422. With 422 saturated, current is forced into the base of 420, causing it also to saturate. When transistors 420 and 422 saturate, the connect lead 416 to lead 402. At the same time, the high condition of CS2 causes transistors 426 and 428 also to saturate, grounding lead 404 (this essentially connects leads 418 and 404). A pulse of high voltage approximately equal to Vin is thereby applied across the output terminals 402 and 404 and to any lamp connected to them.

At the end of the switching interval of controlled switches 408 and 412 (when CS2 goes low), switch controls 410 and 414 are still held in the off state, since control signal CS1 is low. On the negative-going transition of CS2, 424 turns off. Zener diode 456 and diode 458 limit the negative back swing across the base to emitter junction of 424 during turnoff to a value below its breakdown level and diode 458 also prevents zener diode 456 from shunting the base-emitter junction of transistor 424 when it is on.

When 424 is driven into its non-conduction state, the base of 422 rises towards the input voltage Vin and the base-emitter junction of transistor 422 is reverse biased. 422 begins to turn off, which in turn reduces the current in its collector, so that the base drive to 420 is reduced. Speed-up network 464 and 466 aids in the process by producing a negative spike in the base current of 420. Diode 468 prevents excess reverse voltage from appearing between the collector and emitter of transistor 420.

Darlington transistors 426 and 428 are also forced into the non-conducting state on negative-going transitions of CS2 through the action of speed-up network 446,448. The reverse bias voltage at the base of 428 is limited below the breakdown value by zener diode 472, and diode 474 prevents 472 from shunting the base to emitter junction of 428 in the on state.

After control signal CS2 returns to ground, a delay of 3 to 5 microseconds is introduced, in the preferred embodiment, before CS1 goes high to turn on controlled switches 414 and 410. As described earlier, this delay interval is preferably selected to account for storage and fall time (and any other delay) associated with the transistors on each of the switch circuits and prevents all the switches from closing simultaneously. The triangular waveform generator 100 and level detectors 200 and 300 permit convenient fine tuning of the duration of the delay interval between CS2 and CS1 to achieve the maximum possible ON time in the forward and reverse polarity states.

As will be appreciated from FIG. 5, the circuitry associated with switch 408 is identical to that of 414, and the circuitry of switch 412 is identical to that of 410. The elements of these controlled switches are indicated by the same reference numerals as their corresponding elements in 408 and 412. It should be kept in mind, however, that switches 414 and 410 respond to pulses in CS1 instead of CS2. Otherwise, operation is identical. The effect of turning on switches 414 and 410 is to ground lead 402 and place Vin on lead 404 (i.e. connect leads 416 and 404). This produces −Vin between leads 402 and 404. Thus, the signal Vout which is between leads 402 and 404 is essentially a square wave signal which varies from +Vin to −Vin with the slight delay interval introduced between polarity reversals (see waveform Vout in FIG. 2). It may be desirable to filter Vout somewhat to smooth out the delay interval before applying the signal to a lamp circuit.

Figure 6:
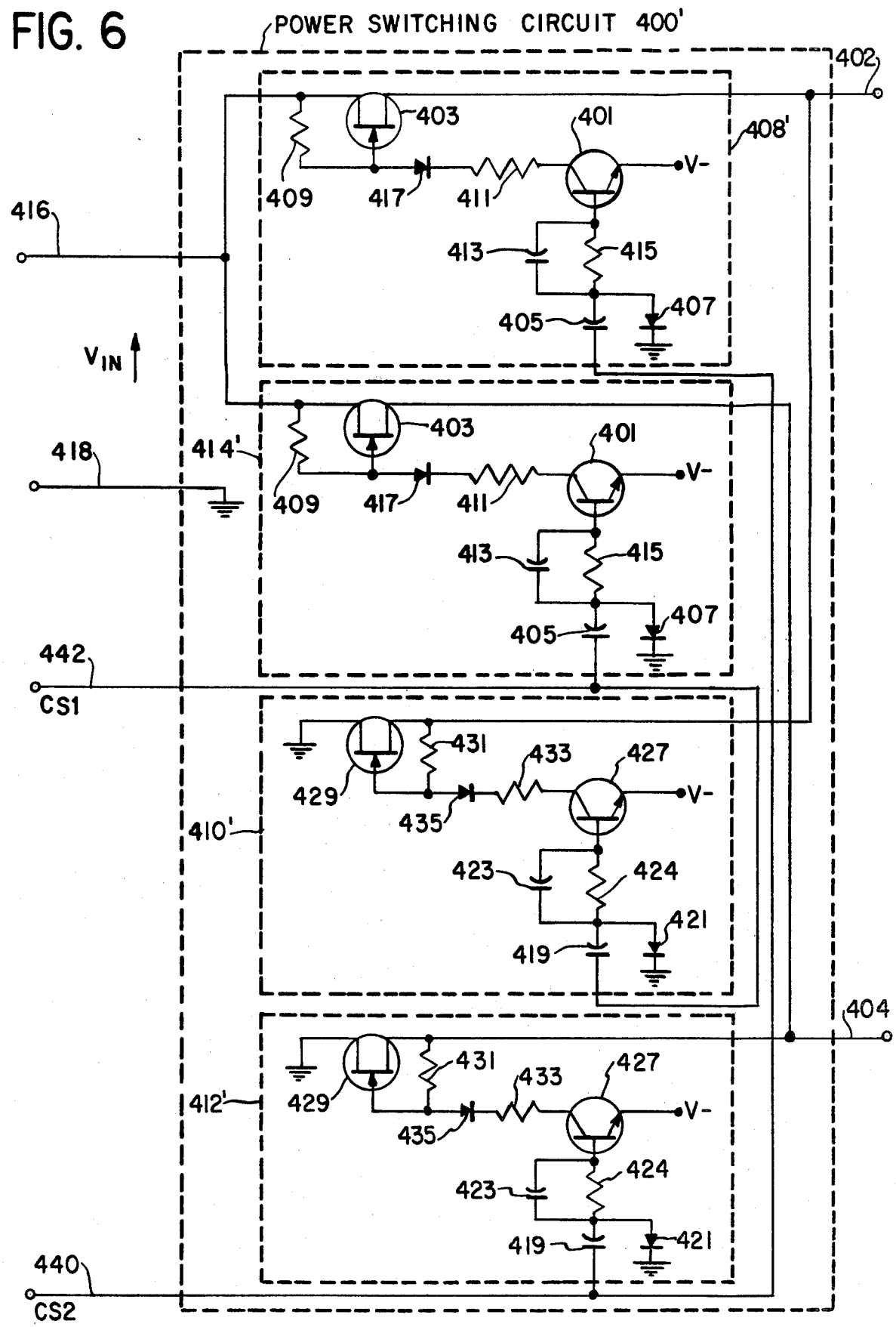
FIG. 6 is a schematic diagram showing an alternate embodiment of the power switching circuit of FIG. 2, using FET switching transistors.

FIG. 6 is a schematic representation of an alternate embodiment 400' of the power switching circuit 400, using conventional high voltage power FETs. Although the schematic indicates the use of N-type depletion JFETs, other available FETs could be readily applied to the cross-coupled application.

In FIG. 6, controlled switch 408' is comprised of an NPN driver transistor 401 and an FET 403. Control signal CS2 is applied to control input terminal 440. Capacitor 405 and diode 407 cooperate to produce a replica of CS2, at the base of 401, which is clamped at ground so as to be negative. Since the emitter of 401 is tied to a negative voltage source, positive excursions of CS1 will forward bias the base-emitter junction of 401, driving it into saturation. This will draw current from the power input terminal 416 through resistors 409 and 411 which provides gate-source biasing of FET 403, turning it on. In the on state 403 provides a low impedance path for drain to source current, effectively closing switch control 408' and connecting input lead 416 to output lead 402, thereby providing Vin at lead 402. Diode 417 protects the gate of 403 from transient spikes.

When CS2 falls, the base of 401 drops toward V−, shutting off the transistor with the aid of speedup network 413, 415. The gate voltage of FET 403 rises through resistor 409, turning it off and stopping the flow of drain to source current. With 403 in the off state, controlled switch 408' is effectively an open circuit between input terminal 416 and output terminal 402.

The circuit elements of controlled switches 410', 412', and 414' are identical in structure and operation to those of switch 408'. It should be borne in mind, however, that switch 412' responds to CS2 to connect lead 404 to ground and that switches 410' and 414' respond to pulses in CS1 to connect leads 402 and 404 to ground and lead 416, respectively.

From the foregoing description it will be appreciated that the circuit in FIG. 6 operates to apply the voltage at input terminals 416 and 418 to output terminals 402 and 404 with forward polarity during positive excusions of CS2 and with reverse polarity during positive excursions of CS1. This produces the desired alternating square wave for the ballast and lamp circuit with the high efficiency characteristic of FET switching circuits.

Although preferred forms of the invention have been disclosed for illustrative purposes, those skilled in the art will appreciate that many additions, modifications or substitutions may be made without departing from the scope and spirit of the invention as defined in the accompanying claims.

What is claimed is:

1. A power switching circuit for gas discharge lamps, comprising:

a source of a timing control signal of predetermined frequency;

first threshold detection means responsive to said timing control signal for generating a first control signal when said timing control signal crosses a first threshold level;

second threshold detection means responsive to said timing control signal for generating a second control signal when said timing control signal crosses a second threshold level;

power switching means responsive to said first and second control signals, and including input terminals adapted for connection to a power source and output terminals adapted for connection to a gas discharge lamp circuit, for connecting said input terminals to said output terminals in a first polarity in response to said first control signal and in a reverse polarity in response to said second control signal.

2. A circuit as in claim 1 wherein said timing control signal source comprises a generating means for producing a repetitive, substantially triangular waveform.

3. A circuit as in claim 2 wherein said first threshold detection means comprises a first signal level comparator having an output and being adapted to receive said triangular waveform and a first reference signal as inputs, said first comparator generating said first control signal at said first comparator output when the signal level of said first reference signal exceeds the level of said triangular waveform; and said second threshold detection means comprises a second signal level comparator having an output and being adapted to receive said triangular waveform and a second reference signal as inputs, said second comparator generating said second control signal at said second comparator output when the signal level of said triangular waveform exceeds the signal level of said second reference signal.

4. A circuit as in claim 3 wherein said first and second control signals generated by said first and second signal level comparators comprise square wave control signals having an on signal level, and said power switching means performs said connection of first polarity only for the duration of said on signal level at said first comparator output and performs said connection of second polarity only for the duration of said on signal level at said second comparator output.

5. A circuit as in claim 3 wherein said power switching means comprises a transistor switching pair and a Darlington connected transistor pair acting as electrical switches and responding to said first control signal to connect said input terminals to said output terminals in a first polarity; and a corresponding transistor switching pair and Darlington connected pair responsive to said second control signal to connect said input terminals to said output terminals in a reverse polarity.

6. A circuit as in claim 3 wherein said power switching means comprises an FET power switching transistor corresponding to each output terminal and responsive to said first control signal to connect said input terminals to said output terminals in a first polarity, and an FET power switching transistor corresponding to each output terminal and responsive to said second control signal to connect said input terminals of said output terminals in a reverse polarity.

7. A circuit as in any one of claims 1–6 further comprising means for setting the relative levels of said first and second reference signals so as to minimize the delay interval between said first and second control signals.

8. A circuit as in claim 2 wherein said triangular waveform has a frequency of approximately 20 kHz.

* * * * *